United States Patent [19]

Sandford, Jr.

[11] 3,967,272

[45] June 29, 1976

[54] DIGITAL TO ANALOG CONVERTER

[75] Inventor: Wayne H. Sandford, Jr., Warrington, Pa.

[73] Assignee: The United States of America as represented by the Secretary of the Navy, Washington, D.C.

[22] Filed: Apr. 25, 1975

[21] Appl. No.: 572,472

[52] U.S. Cl. .................................... 340/347 DA
[51] Int. Cl.² .................................... H03K 13/02
[58] Field of Search ........................... 340/347 DA

[56] References Cited
UNITED STATES PATENTS

| 3,573,803 | 4/1971 | Chatelon et.al. | 340/347 DA |
| 3,714,590 | 1/1973 | Freedman | 340/347 DA X |
| 3,728,717 | 4/1973 | Gowan | 340/347 DA |
| 3,754,236 | 8/1973 | Dotson | 340/347 DA |
| 3,794,995 | 2/1974 | Thompson | 340/347 DA X |
| 3,823,396 | 7/1974 | Lode | 340/347 DA |
| 3,831,167 | 8/1974 | Tewksbury | 340/347 DA |

Primary Examiner—Thomas J. Sloyan
Attorney, Agent, or Firm—R. S. Sciascia; Henry Hansen

[57] ABSTRACT

A digital to analog converter having an n-bit device for converting a 2n-bit digital word to analog form. The converter converts the first n bits of the digital word and stores the analog value in a first sample and hold circuit. The remaining n bits of the word are subsequently converted to analog form and stored in a second sample and hold circuit. The two stored samples are summed in proportion to predetermined weighting factors to produce the analog equivalent of the 2n-bit digital word.

6 Claims, 2 Drawing Figures

DIGITAL TO ANALOG CONVERTER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to digital to analog (D/A) converters and particularly to a digital analog converter which utilizes a conventional n-bit D/A circuit to transform a 2n-bit digital word to analog form.

Generally, the cost, complexity and size of a conventional n-bit digital to analog converter increases rapidly with the number of bits with which the converter is designed to operate. Accordingly, it is desirable that the bit handling capacity of a conventional n-bit D/A converter is increased without substantial increases in cost, complexity size or processing speed. One example of a D/A converter alternately converts selected bits of a multi-bit data word by processing the word through dual D/A converters, each of which accommodate half the number of bits of the word. A time division switching circuit introduces substantial switching transients into the analog processing which further requires a filtering network having a time constant which slows the speed of the conversion process.

SUMMARY OF THE INVENTION

Accordingly, it is an object of the present invention to provide a digital to analog converter apparatus that uses a single n-bit digital to analog converter to perform the analog conversion of a digital word having 2n bits. Another object of the invention is to provide a digital to analog converter apparatus which will operate at a relatively high speed. Yet another object of the present invention is to provide digital to analog converter apparatus which is relatively inexpensive and minimizes size.

Briefly, these and other objects are accomplished by a single digital to analog converter having an analog output that is time division multiplexed. A data source provides serial output data in the form of 2n-bit words which are converted to a parallel bit format and inverted. A conventional n-bit digital to analog converter is connected to receive the inverted parallel data and provides an output current whose magnitude is indicative of the input data received by the converter. A voltage converter is connected to receive the output current which is converted to a proportional output voltage and which is commonly connected to first inputs of a first sample and hold circuit and a second sample and hold circuit. The data source also provides a series of clock pulses to the input of a 2n-bit ring counter which produces output pulses at the nth and 2n counts of the counter. The first sample and hold circuit has a second input which is connected to receive the nth count output pulse from the counter and a second input of the second sample and hold circuit is connected to receive the 2nth count output pulse from the counter. Accordingly, the serial 2n-bit word is converted to analog form and time multiplexed by having a first subgroup of n bits sampled by the first sample and hold circuit and a second subgroup of n bits sampled by the second sample and hold circuit. The first subgroup of n bits is representative of the n least significant bits of the serial 2n-bit word and the second subgroup of the remaining n bits is representative of the n most significant bits of the serial 2n-bit word. A third sample and hold circuit receives the output from the first sample and hold circuit at a time coincident with receipt of the 2nth count output pulse from the counter. Concurrently, the first sample and hold circuit receives the first n bits of a new 2n-bit input word. A summing amplifier provides dual inputs which are connected, respectively, to receive the outputs from the second and third sample and hold circuits and weights these outputs according to predetermined values indicative of the bit weight of the serial input word and produces an output voltage level indicative of the 2n-bit serial input word.

For a better understanding of these and other aspects of the invention, reference may be made to the following detailed description taken in conjunction with the accompanying drawings.

DESCRIPTION OF THE PREFERRED EMBODIMENT

Figure 1:
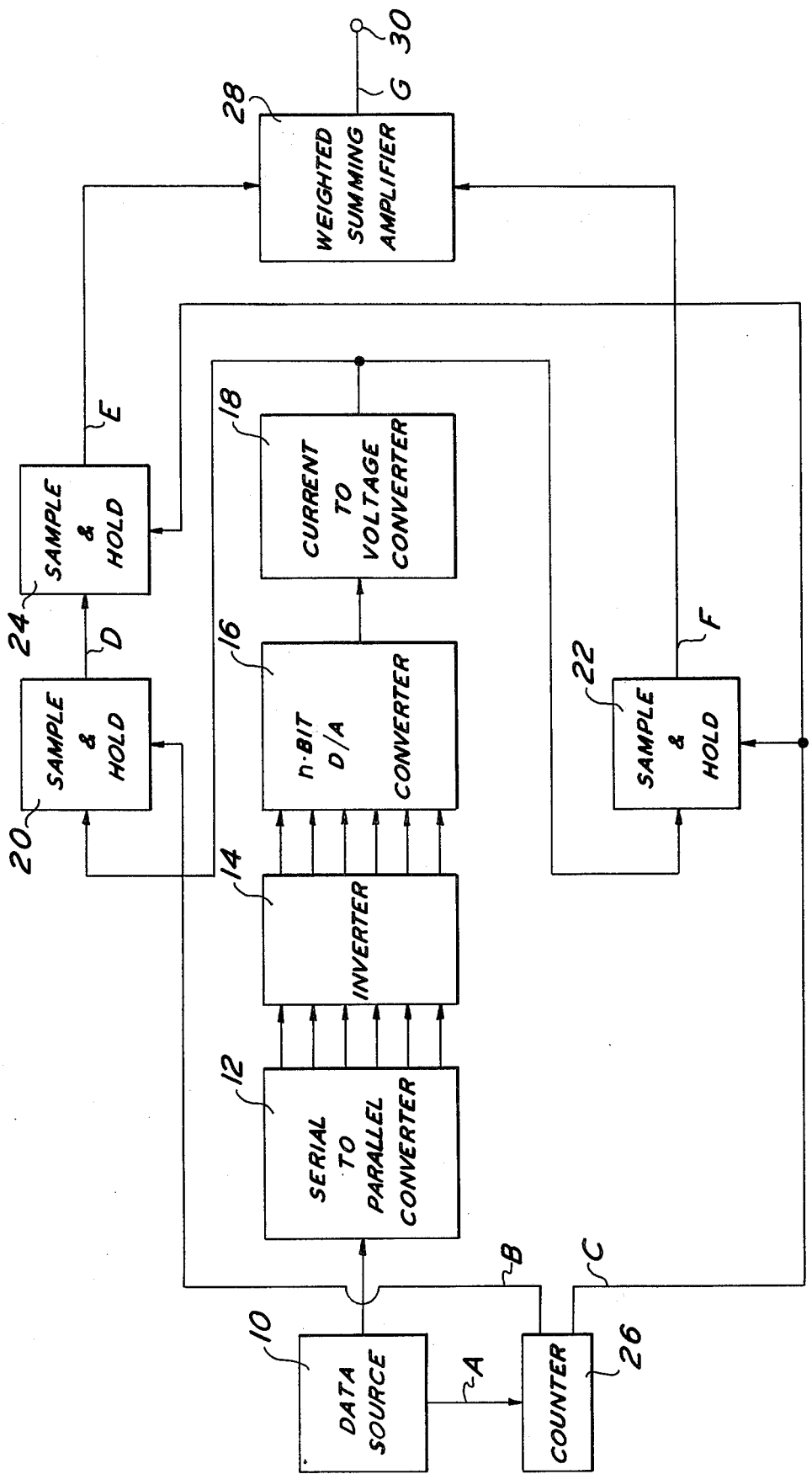
FIG. 1 is a block diagram of the present invention.

Referring now to FIG. 1, there is shown a data source 10 which provide a serial format first output to the input of a serial to parallel converter 12. The converter 12 provides a multiplicity of parallel outputs to corresponding inputs of an inverter 14 which further produces a multiplicity of parallel outputs to corresponding inputs of an n-bit D/A converter 16. The converter 16 produces a single current output to the input of a current to voltage converter 18. The converter 18 produces a voltage output which is commonly connected to the data inputs of a first sample and hold circuit 20 and a second sample and hold circuit 22. The circuit 20 produces an output which is connected to the data input of a third sample and hold circuit 24. A counter 26 is connected to receive a clock pulse train produced at a second output of the data source 10 and which is bit time synchronized with the data produced at the first output of the source 10. The counter 26 provides a first output indicative of the nth count to the sample input of the first sample and hold circuit 20. Also produced by the counter 26 is a second output indicative of the 2nth count of the counter and which is commonly connected to the sample inputs of the second and third sample and hold circuits 22, 24. A weighted summing amplifier 28 having first and second inputs is connected to receive, respectively, the outputs from the second and third sample and hold circuits 22, 24. The amplifier 28 produces a single output which is provided at an output terminal 30.

Figure 2:
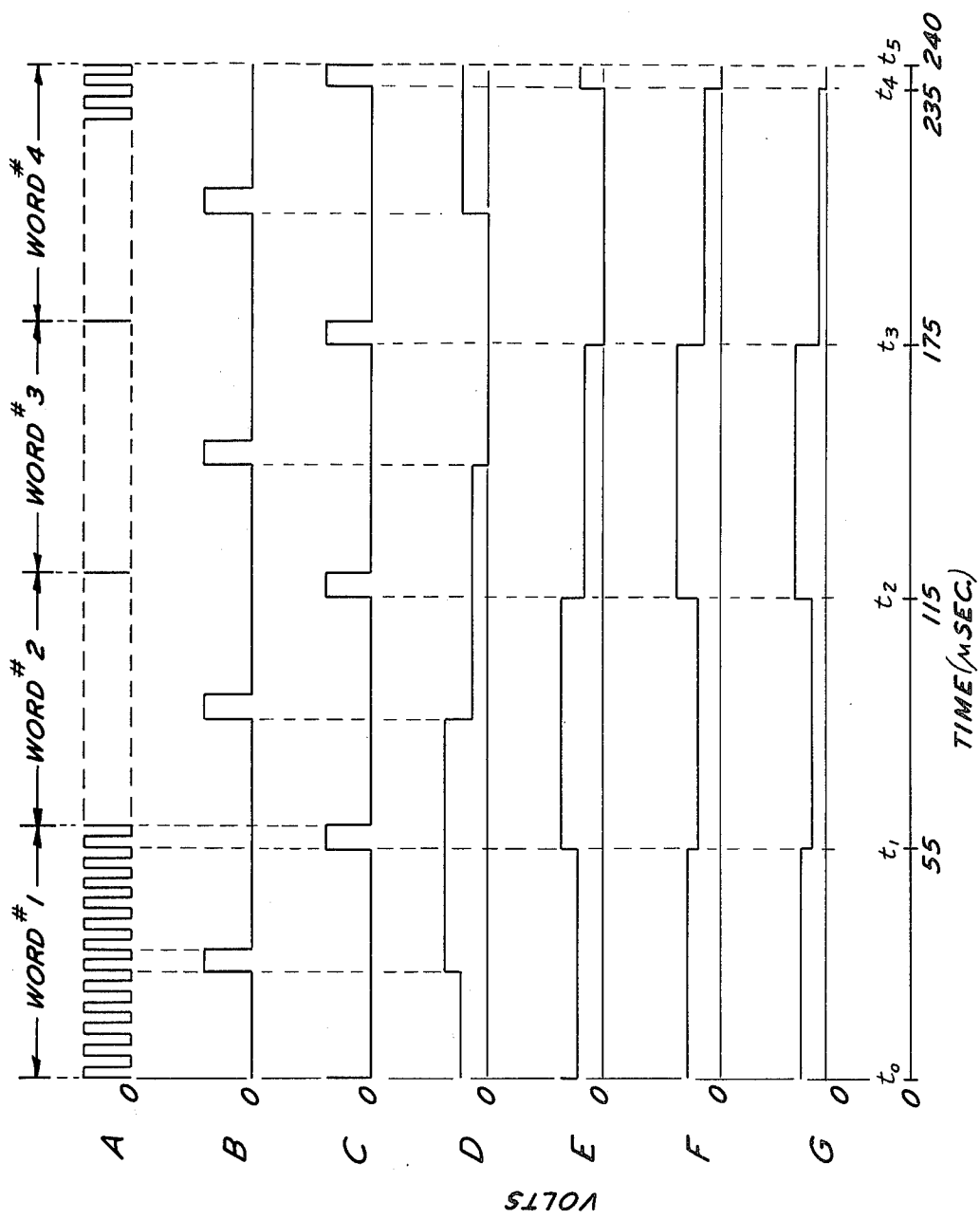
FIG. 2 is a waveform timing chart describing signals generated by the invention shown in FIG. 1.

Referring now to FIG. 2 in conjunction with FIG. 1, the operation of the present invention will be explained. The data produced at the first output of the source 10 comprises a sequence of serial bit words with each word having 12 bits produced over a time period of 60($\mu$sec.) as shown in FIG. 2. It is to be noted that the foregoing word times and lengths are given by way of example only inasmuch as the present invention is capable of much higher data rates and word lengths. Concurrent with the data output from the source 10 and in bit time synchronization therewith is a clock pulse train as shown in waveform A in FIG.2 which comprises a series of twelve clock pulses for each of the output words. The counter 26 is connected to receive the output signal shown in waveform A and produces a first output signal as shown in waveform B which is a series of periodic pulses, each pulse being one bit time wide or five $\mu$sec. and occurring at the nth or sixth count of the counter 26. Assuming that word number one begins at $t_0$, the first pulse shown in waveform B begins at a time 25 $\mu$sec. after $t_0$. The counter 26 also produces a second output as shown in waveform C which comprises a series of periodic pulses each one bit time wide which begin at the occurrence of the 2nth or twelfth count of the counter 26. For example, the first pulse shown in waveform C begins at $t_1$ and coincides with the occurrence of the twelfth clock pulse shown in waveform A. Since the twelfth clock pulse shown in waveform A is time coincident with the twelfth bit of word No. 1 which, like all other words, is 60 $\mu$sec. long, the beginning of the twelfth bit is noted at $t_1$ — fifty five $\mu$sec. after the beginning of word No. 1 at $t_0$.

The twelve bit serial words produced by the source 10 are partitioned into two subgroups of six bits each and are converted to a series of six bit parallel words by the converter 12 and subsequently inverted by the inverter 14 which produces a series of six bit parallel words at its parallel outputs. The n-bit D/A converter 16 is a conventional device such as, for example, a Motorola MC 1406 integrated circuit. This particular integrated circuit has a six bit parallel input and operates with low active input logic. Accordingly, the inverter 14 is required to be operated in conjunction with the converter 16 to provide logic state integrity. If other similar n-bit D/A converters are used which accomodate parallel input high active state logic, the inverter 14 may be eliminated. The converter 16 provides an output signal having a current level indicative of the binary values of six bit subgroups of the particular words being produced by the data source 10. The converter 18 converts the output current level of the converter 16 to a corresponding voltage level output which is commonly connected to the data inputs of the first and second sample and hold circuits 20, 22.

Sample and hold circuit 20 receives the first sampling pulse as shown in waveform B from the counter 26 and samples the voltage level at the data input at this time as shown in waveform D. The sampled voltage level shown in waveform D beginning 25 $\mu$sec. after $t_0$ continues to be held at the output of the circuit 20 for a time duration lapsing at the occurrence of the next sampling pulse shown in waveform B. This voltage level is indicative of the binary value of the first subgroup of word number one. At the termination of the first pulse shown in waveform B of FIG. 2, the data source 10 begins producing the remaining six bits or second subgroup of the first word which are converted to a voltage level by processing operations identical to those used on the first subgroup of the same word. Accordingly, by the time the first pulse at $t_1$ is applied to the sample input of circuit 22, bits 7–12 of the first word have been converted to a voltage level which is present at the data input of the circuit 22. Circuit 22 produces an output as shown in waveform F which has a voltage level indicative of bits 7–12 in the first word. Concurrent with the sampling of the circuit 22, the third sample and hold circuit 24 is sampled at $t_1$ to shift the output level of the first sample and hold circuit 20 into the output of the third sample and hold circuit 24. As shown in waveform E, the sampling operation of the circuit 24 effectively delays the voltage level indicative of bits 1–6 of the first word at $t_1$–$t_2$ a period of 6 bit times as related to the output signal shown in waveform D. While the circuit 24 is holding an analog voltage indicative of the first six bits of data word number one, the second sampling pulse shown in waveform B is applied to the sample and hold circuit 20 to sample a new voltage level indicative of the first six bits of word number two. The above sequencing operation continues for the remainder of the conversion process until all data words are converted. Sample and hold circuits 20, 22, 24 operate to sample a new incoming analog value within the individual time durations of the repetitive sampling pulses shown in waveforms B and C and store the new value within the respective circuits until the beginning of the receipt of a new sampling pulse during which time these circuits sample a yet newer analog value. The sampling occurs within the finite time periods designated by the length of the sampling pulses which, although coincident with the time duration of preselected word bits n and 2n, allow the incorporation of the corresponding preselected bit values into the newly formed sample. Waveforms E and F at $t_1$–$t_2$ show, respectively, voltage levels indicative of bits 1–6, and bits 7–22, of word number one. The summing amplifier 28 has first and second inputs connected to receive, respectively, the output signals shown in waveforms E and F from the circuits 24, 22. Since bits 1–6 have a binary weight value of $2^0 + 2^1 + 2^2 + 2^3 + 2^4 + 2^5 = 63$, and bits 7–12 have a weight of $2^6 + 2^7 + 2^8 + 2^9 + 2^{10} + 2^{11} = 4032$, the amplifier 28 sums the incoming voltage levels according to the foregoing ratios. That is, the voltage level shown in waveform E for any particular word is assigned a weight factor of 63/4095 and the voltage level shown is waveform F for the same word is assigned a weight factor of 4032/4095. Simplifying the foregoing, the levels shown in waveforms F and E are assigned a weighting ratio, respectively of 64:1. The weight factors are effected in the summing amplifier in any convenient manner such as for example, the predetermined selection of resistor values on the dual inputs of an operational amplifier. The amplifier 28 sums the incoming signal in the foregoing ratios and produces a resulting voltage output which is the analog equivalent of the original 12 bit digital word.

Thus it may be seen that there has been provided novel digital to analog converter apparatus which converts a 2n-bit serial input word to an analog form utilizing a single n-bit digital to analog converter.

Obviously, many modifications and variations of the invention are possible in light of the above teachings. For example, the present invention can be applied to any number of desired conversions. In light of the above teachings, similar time switching techniques can be employed to successfully convert digital words having a number of bits that are many integer multiples greater than a number of bits in the single D/A converter required for processing. It is therefore to be understood that within the scope of the appended claims the invention may be practiced otherwise than as specifically described.

What is claimed is:

1. A digital to analog converter having a digital data source for producing a series of 2n-bit serial words at a first output and a bit synchronized pulse train at a second output, comprising, in combination:

conversion means adapted to receive the data source first output for sequentially converting the 2n-bit serial words into first and second parallel n-bit outputs;

an n-bit digital to analog converter operatively connected to receive said conversion means outputs for converting respective ones of said outputs to corresponding analog signals;

counting means adapted to receive the data source second output for periodically producing a first output signal during the nth bit interval of each of said 2n-bit words and a second output signal during the 2nth bit interval of each of said 2n-bit words;

first sample and hold means operatively connected to receive said converter output signals and said counting means first output signal for sampling said analog signals during the nth bit interval of each of said 2n-bit words and for storing an analog output representative thereof;

second sample and hold means operatively connected to receive said converter output signals and said counting means second output signal for sampling said analog signals during the 2nth bit interval of each of said 2n-bit words and for storing an analog output representative thereof;

third sample and hold means connected to receive said first sample and hold means output and said counting means second output signal for sampling said first sample and hold means output during the 2nth bit interval of each of said 2n-bit words and for storing an analog output representative thereof; and summing means connected to receive said second and third sample and hold means analog outputs for summing said analog outputs according to a predetermined weighted ratio and for producing an analog output signal indicative of the binary value of each of the serial words.

2. A digital to analog converter according to claim 1 wherein said counting means is a 2n-bit ring counter wherein the first output signal is indicative of the nth count and the second output signal is indicative of the 2nth count.

3. A digital to analog converter according to claim 2 wherein said conversion means first parallel n bit output is representative of the n least significant bits in the 2n-bit serial word and said second parallel n bit output is representative of the n most significant bits in the 2n-bit serial word.

4. A digital to analog convertor, comprising in combination:

a source of digital data for producing a series of 2n-bit serial words at a first output and a bit synchronized pulse train at a second output;

conversion means connected to receive the data source first output for sequentially converting the 2n-bit serial words into first and second parallel n-bit outputs;

an n-bit digital to analog converter operatively connected to receive said conversion means outputs for converting respective ones of said outputs to corresponding analog signals;

counting means connected to receive the data source second output for periodically producing a first output signal during the nth bit interval of each of said 2n-bit words and a second output signal during the 2nth bit interval of each of said 2n-bit words;

first sample and hold means operatively connected to receive said converter output signals and said counting means first output signal for sampling said analog signals during the nth bit interval of each of said 2n-bit words and for storing an analog output representative thereof;

second sample and hold means operatively connected to receive said analog converter means output signals and said counting means second output signal for sampling said analog signals during the 2nth bit interval of each of said 2n-bit words and for storing an analog output representative thereof;

third sample and hold means connected to receive said first sample and hold means output and said counting means second output signal for sampling said first sample and hold means output during the 2nth bit interval of each of said 2n-bit words and for storing an analog output representative thereof; and summing means connected to receive said second and third sample and hold means analog outputs for summing said analog outputs according to a predetermined weighted ratio and for producing an analog output signal indicative of the binary value of each of the serial words.

5. A digital to analog converter according to claim 4, wherein said counting means is a 2n-bit ring counter wherein the first output signal is indicative of the nth count and the second output signal is indicative of the 2nth count.

6. A digital to analog converter according to claim 5 wherein said conversion means first parallel n bit output is representative of the n least significant bits in the 2n-bit serial word and said second parallel n bit output is representative of the n most significant bits in the 2n-bit serial word.

* * * * *